United States Patent
Govindarajan et al.

(12) 
(10) Patent No.: US 6,812,162 B2
(45) Date of Patent: Nov. 2, 2004

(54) RAPID DEPOSITION OF BOROSILICATE GLASS FILMS

(75) Inventors: Shrinivas Govindarajan, Glen Allen, VA (US); Mukund Patel, Glen Allen, VA (US)

(73) Assignee: Infineon Technologies Richmond, LP, Sandston, VA (US)

(*) Notice: Subject to any disclaimer, the term of this patent is extended or adjusted under 35 U.S.C. 154(b) by 0 days.

(21) Appl. No.: 10/255,015

(22) Filed: Sep. 25, 2002

(65) Prior Publication Data

US 2004/0058559 A1 Mar. 25, 2004

(51) Int. Cl.$^7$ ................... H01L 21/31; H01L 21/469
(52) U.S. Cl. ................. 438/783; 438/758; 438/778; 438/787
(58) Field of Search .............. 427/255.29, 255.37; 438/758, 778, 783, 787

(56) References Cited

U.S. PATENT DOCUMENTS 6,344,422 B1 2/2002 Borgognoni ............. 438/778
6,599,574 B1 * 7/2003 Yieh et al. ............. 427/255.29

* cited by examiner

*Primary Examiner*—Kamand Cuneo
*Assistant Examiner*—Asok Kumar Sarkar

(57) ABSTRACT

A method for rapidly depositing a borosilicate glass film on a semiconductor wafer includes controlling the pressure within the chamber, introducing oxygen into the chamber, introducing a carrier gas into the chamber, injecting triethyl borate ("TEB") and tetraethyl orthosilicate ("TEOS") into the chamber, stabilizing the injection of TEB and TEOS, adjustably spacing a heater relative to the chamber, introducing ozone gas into the chamber, and depositing borosilicate glass film at a rate of at least about 4,500 angstroms per minute.

28 Claims, 7 Drawing Sheets

| Step Number | 1 | 2 | 3 | 4 |
|---|---|---|---|---|
| Name | STAB | RAMP | STAB | FLOW IN SPEC |
| Chamber Selection | A,B,C,D | A,B,C,D | A,B,C,D | A,B,C,D |
| Step End Control | By Time | Pressure > 180 T | By Time | FLOWS in SPEC |
| Max. Step Time | 5 | 25 | 6 +3/-1 | 6 |
| Endpoint Selection | No Endpoint | No Endpoint | No Endpoint | No Endpoint |
| Pressure | Throttle to 800 | Servo 260 Torr | Servo 260.0 Torr | Servo 260.0 Torr |
| Pressure Ramp Rate | 0 steps/second | 0 Torr/second | 0 Torr/second | 0 Torr/second |
| RF Power/RF2 Power | OW, OW | OW, OW | OW, OW | OW, OW |
| Heater Temperature | 480°C (Wafer~431°C) | 480°C (Wafer~440°C) | 480°C (Wafer~440°C) | 480°C (Wafer~440°C) |
| Temperature Ramp | 0.0 C/sec | 0.0 C/sec | 0.0 C/sec | 0.0 C/sec |
| Heater Spacing | 500 mils | 500 mils | 180 to 260 mils | 180 to 260 mils |
| Gases: | | | | |
| O2 | 4000 sccm | 6000 sccm | 4000 sccm | 4000 sccm |
| O3 | 6000 sccm | 8000 sccm | 6000 sccm | 6000 sccm |
| HE-HI | - | - | - | - |
| HE-LO | - | 600 mgm | 600 mgm | 600 mgm |
| TEOS | - | - | - | 300 mgm |
| TEB | - | - | - | |
| Temp Preset | 350 mWatts±600 mW | 350 mWatts±600 mW | 300 mWatts±600 mW | 300 mWatts±600 mW |
| Liq Inj Bypass | To Chamber | To Chamber | To Chamber | To Chamber |
| Microwave Gen Power | 0 Watts | 0 Watts | 0 Watts | 0 Watts |

| 5 | 6 | 7 | 8 | 9 |
|---|---|---|---|---|
| TEMP IN SPEC | DEPOSITION | DEPOSITION | DEPOSITION | DEPOSITION |
| A, B, C, D | A | B | C | D |
| Temperature in spec | By Time | By Time | By Time | By Time |
| 2 | 81-96 | 81-96 | 81-96 | 81-96 |
| No Endpoint | No Endpoint | No Endpoint | No Endpoint | No Endpoint |
| Servo 260.0 Torr | Servo 260.0 Torr | Servo 260.0 Torr | Servo 260.0 Torr | Servo 260.0 Torr |
| 0 Torr/second | 0 Torr/second | 0 Torr/second | 0 Torr/second | 0 Torr/second |
| 0W, 0W | 0W, 0W | 0W, 0W | 0W, 0W | 0W, 0W |
| 480°C (Wafer~440°C) | 480°C (Wafer~440°C) | 480°C (Wafer~440°C) | 480°C (Wafer~440°C) | 480°C (Wafer~440°C) |
| 0.0 C/sec | 0.0 C/sec | 0.0 C/sec | 0.0 C/sec | 0.0 C/sec |
| 180 to 260 mils | 180 to 325 mils | 180 to 325 mils | 180 to 325 mils | 180 to 325 mils |
| 4000 sccm | 4000 sccm | 4000 sccm | 4000 sccm | 4000 sccm |
| 6000 sccm | 6000 sccm | 6000 sccm | 6000 sccm | 6000 sccm |
| 600 mgm | 1800 +/-250 mgm | 1800 +/-250 mgm | 1800 +/-250 mgm | 1800 +/-250 mgm |
| 300 mgm | 280 +/-85 mgm | 280 +/-85 mgm | 280 +/-85 mgm | 280 +/-85 mgm |
| 300 mWatts ± 600 mW | 200 mWatts ± 600 mW | 200 mWatts ± 600 mW | 200 mWatts ± 600 mW | 200 mWatts ± 600 mW |
| To Chamber | To Chamber | To Chamber | To Chamber | To Chamber |
| 0 Watts | 0 Watts | 0 Watts | 0 Watts | 0 Watts |

512

| | 10 | 11 | 12 | 13 |
|---|---|---|---|---|
| | TERM | P1 | P2 | P3 |
| | A,B,C and D | A,B,C,D | A,B,C,D | A,B,C,D |
| | By Time | By Time | By Time | By Time |
| | 3 | 10 | 5 | 5 |
| | No Endpoint | No Endpoint | No Endpoint | No Endpoint |
| | Servo 260.0 Torr | Throttle to 400 | Throttle to 800 | Throttle fully open |
| | 0 Torr/second | 10 steps/second | 20 steps/second | 0 steps/second |
| | OW, OW | OW, OW | OW, OW | OW, OW |
| | 480°C (Wafer~440°C) | 480°C (Wafer~431°C) | 480°C (Wafer~431°C) | 480°C (Wafer~431°C) |
| | 0.0 C/sec | 0.0 C/sec | 0.0 C/sec | 0.0 C/sec |
| | 180 to 325 mils | 180 to 325 mils | 180 to 325 mils | 550 mils |
| | - | 4000 sccm | 3000 sccm | -1 sccm |
| | 4000 sccm | 4000 sccm | 4000 sccm | - |
| | 6000 sccm | 2000 sccm | 2000 sccm | -1 FPmp |
| | - | - | - | - |
| | 600 +/- 60 mgm | - | - | - |
| | 200 mWatts±600 mW | 200 mWatts±600 mW | 200 mWatts±600 mW | 200 mWatts±600 mW |
| | To Chamber | To Chamber | To Chamber | To Chamber |
| | 0 Watts | 0 Watts | 0 Watts | 0 Watts |

FIG. 5C

RAPID DEPOSITION OF BOROSILICATE GLASS FILMS

BACKGROUND OF THE INVENTION

The present disclosure relates to semiconductor manufacturing, and, in particular, to the deposition of borosilicate glass ("BSG") films. In the manufacture of semiconductor devices, BSG is typically used as a hard mask for etch processes. Because the hard mask is a sacrificial film, increasing the deposition rate of the BSG hard mask presents opportunities to enhance throughput and/or reduce manufacturing costs. BSG is typically deposited using low-pressure chemical vapor deposition ("LPCVD") at a pressure of 1 Torr using triethyl borate ("TEB") and tetra-ethyl orthosilicate ("TEOS") at temperatures of 750° C. to 850° C.

BSG films have also been produced by the reaction between TEB and TEOS at pressures below 1 Torr and temperatures of 400° C. to 500° C., such as, for example, described in U.S. Pat. No. 6,344,422 to Borgognoni, et al., entitled "Method of Depositing a BSG Layer", issued Feb. 5, 2002. In addition, BSG films have been grown using sub-atmospheric chemical vapor deposition ("SACVD") at pressures of 200 Torr and temperatures of 470° C. to 500° C. Such parameters generally yield deposition of BSG at rates up to about 4100 angstroms per minute.

SUMMARY OF THE INVENTION

The above and other drawbacks and disadvantages of the prior art are addressed by a method for rapidly depositing a borosilicate glass film on a semiconductor wafer within a chemical vapor deposition ("CVD") reaction chamber. The presently disclosed method includes controlling the pressure within the chamber, introducing oxygen into the chamber, introducing a carrier gas into the chamber, injecting triethyl borate ("TEB") and tetra-ethyl orthosilicate ("TEOS") into the chamber, stabilizing the injection of TEB and TEOS, adjustably spacing a heater relative to the chamber lid or shower head, introducing ozone gas into the chamber, and depositing borosilicate glass film at a rate of at least about 4,500 angstroms per minute.

These and other aspects, features and advantages of the present disclosure will become apparent from the following description of exemplary embodiments, which is to be read in connection with the accompanying drawings.

BRIEF DESCRIPTION OF THE DRAWINGS

The present disclosure teaches a method and apparatus for rapid deposition of borosilicate glass ("BSG") films in accordance with the following exemplary figures, in which:

FIGS. 5a through 5c show a table of reaction conditions and results for a method of the present disclosure.

DETAILED DESCRIPTION OF PREFERRED EMBODIMENTS

Figure 1B:
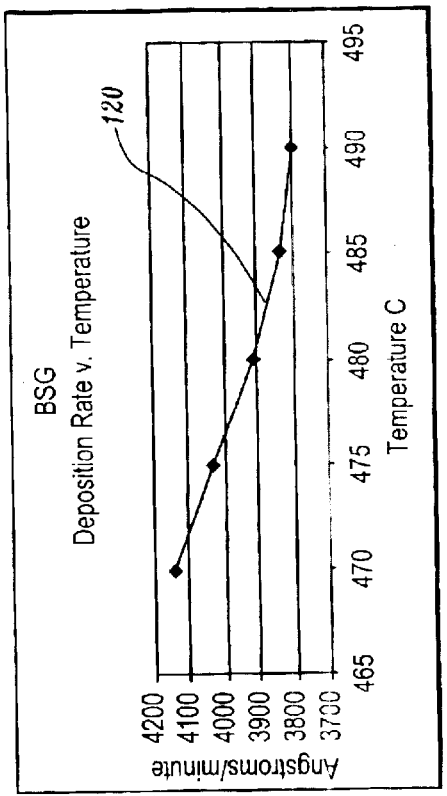
FIGS. 1a through 1d show plots of experimental results for measurements of various process parameters.

The present disclosure relates to high deposition rate processes for the rapid deposition of borosilicate glass ("BSG") films. While typical deposition rates in the pertinent art are up to about 4,100 angstroms per minute, exemplary method embodiments of the present disclosure produce deposition rates of at least about 4,500 angstroms per minute, and preferably about 5,000 angstroms per minute. A useful feature of the present disclosure is the tailoring of the interface to provide a flatter boron profile at the interface with the underlying film. The target dopant level is decreased from 4 percent by weight ("wt. %") to 3.1 wt. % to adjust the wet and dry etch rates to match the downstream processing requirements of the exemplary integration scheme. For the exemplary process flow, the higher dry etch rate with 4 wt. % boron ("B") results in a reduction of the remaining BSG after the silicon etch to levels below the desired range. Further reducing the wt. % B ("% B") very much below 3.1 wt. % results in etch rates comparable to the old process. If the etch chemistry is not very aggressive, as understood in the art, even 4% B will work. Cross-sections from patterned wafers indicate that high deposition rate method embodiments of the present disclosure meet all requirements for deep-trench silicon etch processes.

Referring to FIGS. 1a through 1d, process parameters that affect deposition rate are identified to include chamber pressure, temperature, flow rates of the reactants, and heater spacing, meaning the distance between the shower head and the heater surface. Thus, a plot of BSG deposition rate versus heater spacing is indicated generally by the reference numeral 110 of FIG. 1a, a plot of BSG deposition rate versus temperature is indicated generally by the reference numeral 120 of FIG. 1b, a plot of BSG deposition rate versus pressure is indicated generally by the reference numeral 130 of FIG. 1c, and overlaid plots of BSG deposition rate versus pressure and percentage of boron versus pressure are indicated generally by the reference numerals 140 and 142, respectively, of FIG. 1d. These parameters were determined using test runs in C×Z Gigafill® chambers on an Applied Materials Centura® 5200 platform. Because the chambers typically process multiple films, temperature was taken out of the experimental matrix. Thus, the most promising remaining parameters were pressure and flow rate of the reactants. The graphs shown throughout the Figures were originally generated with statistical software sold by SAS Institute, Inc. under the trade name JMP®.

Figure 1D:
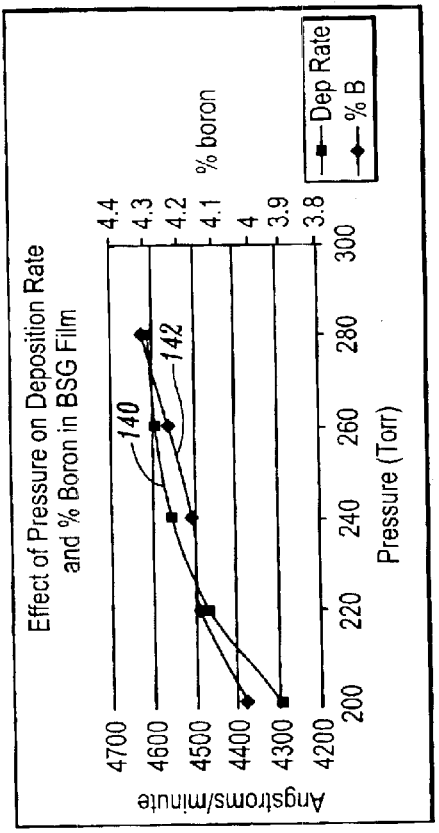
Figure 1A:
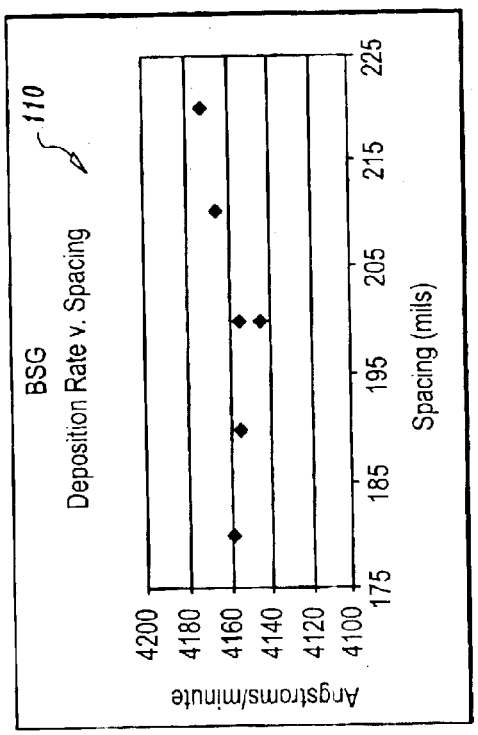
Figure 1C:
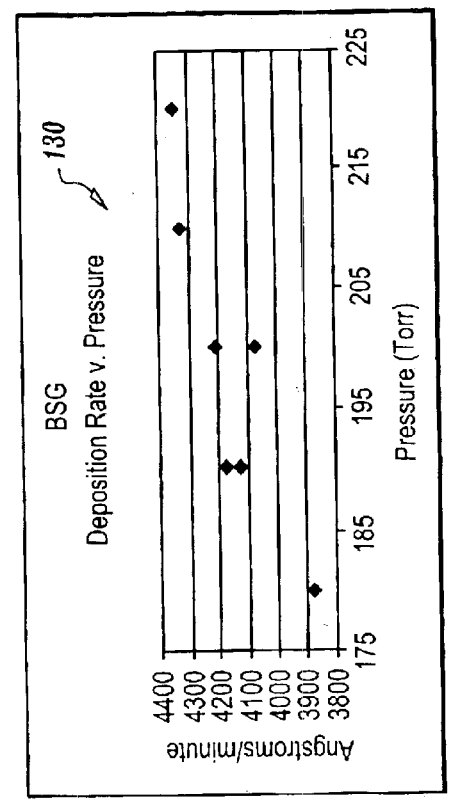

The effect of pressure is illustrated in the plots 130 and 140 of FIGS. 1c and 1d, respectively, indicating that a 20% increase in deposition rate is achievable by increasing reaction pressure. In addition, it can be seen from the overlaid plot 142 of FIG. 1d that increasing reaction pressure results in a higher boron concentration in the BSG film. The higher boron concentration in the film reveals the potential for an even higher deposition rate because the TEOS flow may now be increased to reduce the boron concentration back to an original target level. Conversely, increasing TEB flow would result in an increase in boron concentration rather than a decrease. The flattening of the deposition rate around 260 Torr suggests a possible region in which to explore the new process. To achieve targets for boron concentration while boosting deposition rates, experiments were conducted to determine the effects of the reactants on film parameters.

Figures 2A, 2B:
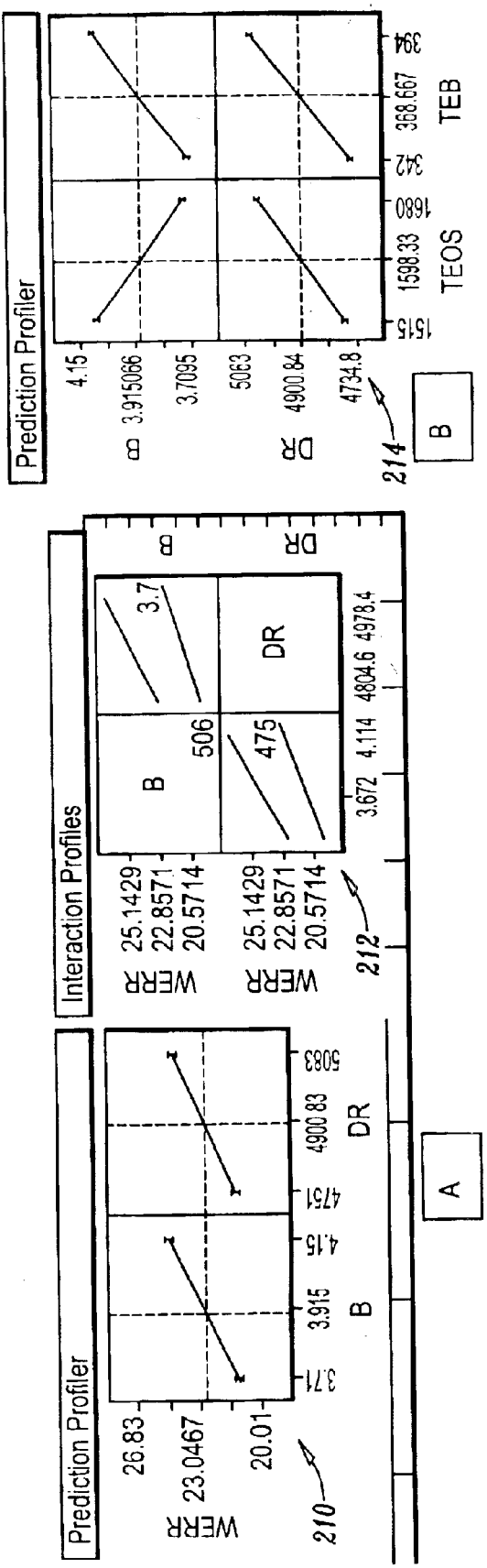
FIG. 2a shows plots of the effects of triethyl borate ("TEB") and tetra-ethyl orthosilicate ("TEOS") on deposition rate and boron concentration.
FIG. 2b shows plots of the effects of deposition rate and boron concentration on wet etch ratios.

As shown in FIG. 2a, prediction profile plots are indicated generally by the reference numeral 210, and interaction profile plots are indicated generally by the reference numeral 212. Together, the plots 210 and 212 show the effects of deposition rate ("DR") in units of angstroms per minute ("Å/min") and boron concentration ("B") on the wet etch rate ratio ("WERR") at 150:1 dilute hydrofluoric acid ("DHF") for 5 minutes, normalized with respect to thermal oxide etch rate.

As shown in FIG. 2b, prediction profile plots are indicated generally by the reference numeral 214, and show the effects of the reactants TEOS and TEB on the boron concentration ("% B" or "B") and deposition rate ("DR"), in units of Å/min, for a high deposition rate process according to an embodiment of the present disclosure. As a sacrificial layer, the BSG is stripped off after the etch process. The wet etch rate test used to generate these graphs consists of processing the wafer with the BSG film in the wet etch chemistry and measuring the film thickness after the wet etch. The wet etch rate ratio ("WERR") is derived by dividing the wet etch rate for the BSG film with that obtained for a thermal oxide film, such as, for example, a film that is grown in a diffusion oxidation furnace.

"DR" is the deposition rate, expressed here in units of angstroms per minute ("Å/min") or angstroms per second ("Å/sec"). All else being equal, the higher the deposition rate, the less dense the resulting film. The wet etch rate is intimately related to both the deposition rate and % B. As the % B increases, the film becomes easier to etch, thus the wet etch rate increases. As the deposition rate increases, the wet etch rate increases since the film is less dense and more easily attacked or etched. The headings "Prediction Profiler" and "Interaction Profile" are merely those of the JMP software package used to originally generate the images.

Figure 3B:
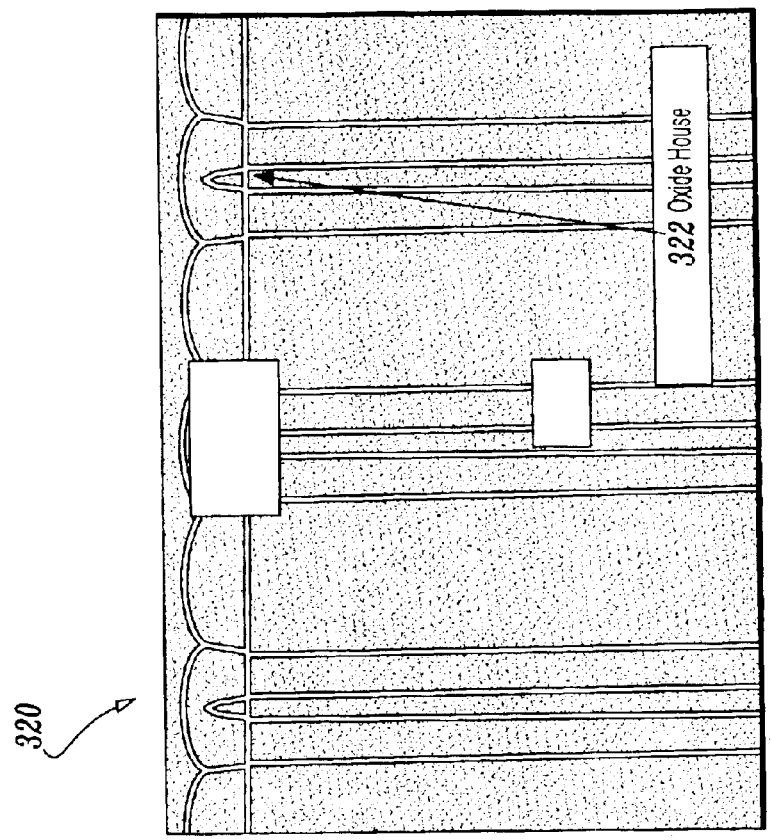
FIGS. 3a and 3b show cross-sectional views of test wafers.
Figure 3A:
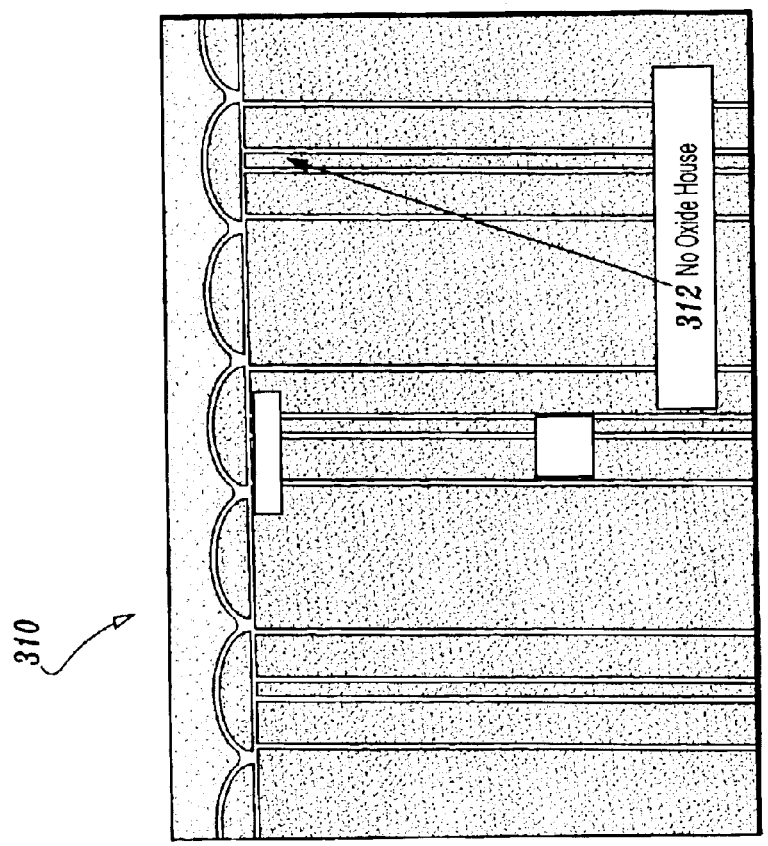

Referring now to FIGS. 3a and 3b, cross-sectional side views of two "short flow wafers" are indicated generally by the reference numerals 310 and 320, respectively. The high deposition rate BSG film formed by this exemplary embodiment of the present disclosure was evaluated with short flow wafers, where "short flow wafers" are wafers that flow the normal process steps up to a certain point and are then classified as test wafers. Thus, short flow wafers are intercepted for testing and not used as finished product. These short flow wafers are used to examine the process flow through the mask open etch and the deep trench silicon etch steps. While the critical dimensions for the mask open etch were shown to be within control tolerances, an anomaly was seen during the deep trench etch processes. A cross-section from the edge of the wafer 310, where the etch rate is higher, is shown in FIG. 3a. The anomaly was that the "oxide house", which refers to the residual BSG after the etching process, had been etched away as indicated by the reference numeral 312. This results in "faceting" of the underlying nitride and the formation of "silicon splinters".

As shown for the wafer 320 of FIG. 3b, the remedy for this anomaly is to decrease the boron concentration, as suggested by the observation of an increasing trend for the survival of the oxide house as a function of decreasing boron concentration. Wet etch rate and dry etch rate experiments were conducted to confirm the possibility of matching the etch rates seen with process of record ("POR") films documenting the manufacturing processes. To match the POR wet etch rate, the boron content may be decreased to around 3%. By matching the etch rate, the etch process step does not have to be altered due to the changes in the BSG process.

To provide a reasonable process window, subsequent experiments with short flow wafers were conducted with boron content ranging between 2.8 and 3.4%. Once again, no issues were seen with the critical dimensions obtained after the mask open etch. FIG. 3b shows a cross-section after the deep trench etch for a wafer processed with a deposition rate of 5,000 Angstroms per minute and a boron content of 3.4%. Here, the oxide house 322 is seen to be adequate.

Figure 4A:
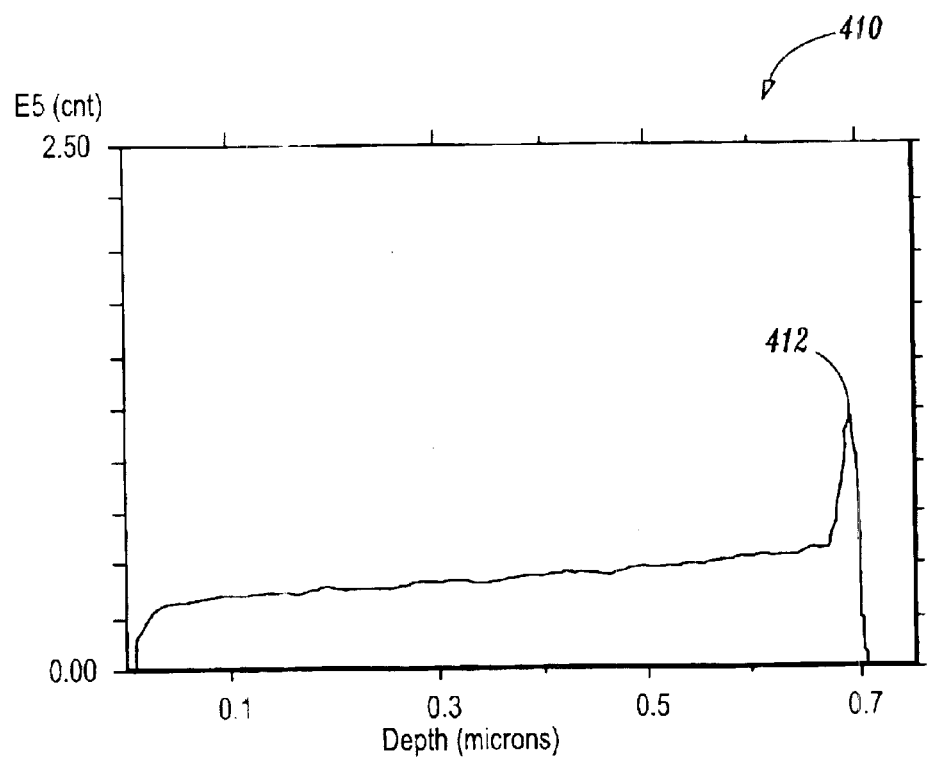
FIGS. 4a and 4b show plots of boron dopant concentration profiles at the interface between a BSG film and a nitride layer.
Figure 4B:
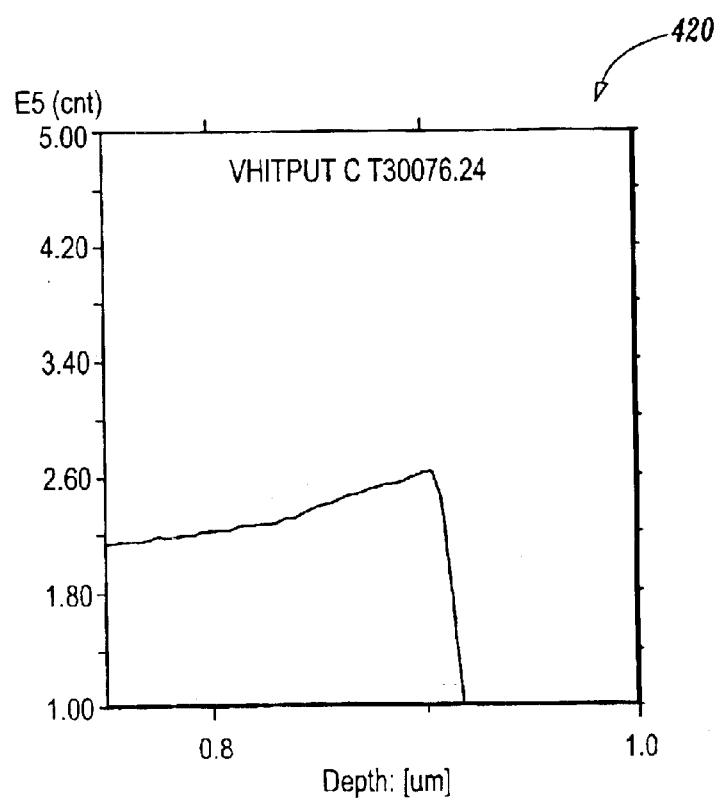

Referring now to FIGS. 4a and 4b, plots of boron content ("cnt") versus depth are indicated generally by the reference numerals 410 and 420 in the respective Figures. The engineering of the boron dopant profile at the interface between the BSG film and the underlying nitride layer was analyzed. The source of boron, TEB, is introduced at the onset of deposition in the POR. This often results in a spike in the boron content at the interface as seen at the spike 412 of FIG. 4a. One option to minimize the boron spike is to ensure that the liquid flow meter response is ideal. TEB is delivered into the process chamber through a liquid flowmeter ("LFM"), which controls the amount of liquid flowing, and an injection valve where the liquid is vaporized and transported to the chamber by a helium carrier gas, for example. Following adjustment of the gain and response for the liquid flow meters, the amount of liquid flow is controlled by the liquid flow meter and the response controls the initial TEB delivery.

In a preferred embodiment, the liquid delivery steps in the deposition recipe are modified. Tests were conducted with the TEOS and TEB either stabilized through the chamber prior to deposition, which was initiated with the introduction of ozone, or diverted to the pumps. Stabilizing the TEB flow through the chamber provides a much flatter boron depth profile near the interface, as shown in the plot 420 of FIG. 4b. In addition to the significant throughput improvement, this process provides a reduction in the cost per wafer due to more complete reactions at elevated pressure and the reduction in the target dopant level of boron. By "stabilizing", what is meant is introducing the reactants into the reaction chamber under conditions of "Flows in Spec", which forces the reactants to flow stably before moving to the next step.

Turning to FIGS. 5a through 5c, a typical process in accordance with an exemplary embodiment of the present disclosure is illustrated generally in table form by the reference numerals 510, 512 and 514, respectively. As shown in the table, five steps are preferably executed to achieve stable conditions just prior to depositing a 7,000-angstrom thick film in step 6 at the enhanced rates as taught herein. The table is indicative of deposition in an Applied Materials Centura® 5200 platform, but it shall be understood that the methods shown therein may be easily adapted to other platforms by those of ordinary skill in the pertinent art. Values highlighted with bold print indicate process parameters that were neither taught nor suggested by typical processes. The entirety of step 5 is in bold, because the entire step is novel. Step end control is by time such that the step ends at the duration specified by "maximum step time".

In this exemplary embodiment, the maximum step time is 5 seconds for the stabilization steps, there is no endpoint selection, pressure is throttled to 800 steps, which corresponds to the fully open position for the throttle valve, the pressure ramp rate is zero meaning that the pressure is not ramped, no radio frequency ("RF") power is applied in any of these steps, the temperature is normally set at about 480° C., the temperature ramp is listed as zero in all the steps meaning that the temperature is not ramped, the spacing is initially set at 500 mils, oxygen is fed into the reaction chamber at 4,000 standard cubic centimeters per minute ("sccm") and Helium or other inert gas is introduced at the rate of 6,000 sccm by the He-Hi mass flow controller. Here, He-Hi refers to one of the two mass flow controllers used to regulate the flow rate of the Helium gas to each chamber. One mass flow controller is called the He-Hi controller and has a mass flow rate capacity of 10,000 sccm, and the other is called He-Lo and has a mass flow rate capacity of 3,000 sccm; the one selected is dependent on the magnitude of the required flow. No TEOS or TEB is introduced in the first step. The temperature preset ("temp preset"), which is a parameter used to control the rate at which the heater temperature recovers to its set point, is preset at about 350 mW plus or minus 600 mW. The preset being negative means that the voltage which is used to drive the heater to its set point is lower; thus, the temp preset is used to control the response of the heater. This is useful, for example, when large amounts of gas are introduced in a step. For every 50 mW increase in the preset, the heater voltage is increased by about 1.8%. Liquid injection bypass is set to the chamber by a software feature that allows for the liquid flows to be sent to the chamber as in this exemplary embodiment, or alternately diverted to the pump before entering the chamber, for all steps, and no microwave energy is used during any of the steps.

In step 2, "RAMP", the step end control is brought higher than about 180 Torr, compared with the typical prior value of 160 Torr, which determines when the recipe moves to the next step, where the typical recipe would have resulted in the transition to step 3 sooner than this preferred embodiment. Thus, this embodiment ensures that the recipe is stabilized within the duration of the next step, namely the step 3 for stabilization ("STAB").

In addition, the pressure is set at about 260 Torr, compared to 200 Torr for typical processes, by means of a proportional, integral and derivative ("PID") controlled servo-motor that maintains the process at a stable pressure set point. In general, the pressure will preferably be greater than 220 Torr, more preferably greater than 240 Torr, and will generally not exceed a pressure of about 350 Torr. This pressure range will be maintained through step 10. During this step, it is preferred that the oxygen and inert gas flows be increased, generally by at least 25% to 75% over typical processes as known in the art. In the exemplary embodiment shown, the oxygen flow is boosted 50% to 6,000 sccm and the inert gas flow boosted 33% to 8,000 sccm. TEOS flow of 600 milligrams per minute ("mgm") is also introduced in this step.

Thus, in step 3 a stabilization ("STAB") is performed wherein the oxygen and inert flows are reduced to values in line with typical process values, and triethyl borate ("TEB") is now introduced at a rate of about 300 milligrams per minute ("mgm"), where typical processes did not involve stabilization of the triethyl borate. This rate is maintained through step 5. Note that the Maximum Step Time is set between about 5 to about 9 seconds, preferably about 6 seconds, where this step did not exist in typical processes.

Step 4 is the optional, but preferred, step of "Flow in Spec", which stabilizes the flow of reactants into the reaction chamber. Here, the step end control is "Flows in Spec", the maximum step time is raised to about 6 seconds again, which stabilizes the flow by waiting to move to the next step until the changes in flow rate are within a predefined tolerance. Thus, the "flows in spec" condition will not allow the recipe to move past this step until all the flow rates are stable, such as, for example, until the fluctuation is below a user-specified range or 7% of set-point in the exemplary embodiment.

In step 5 the "Temp in Spec" check is executed where the deposition process does not start or move past this step until the temperature of the heater is within a certain user specified range, such as 10 degrees centigrade in this exemplary embodiment; which is similar to step 3 except that the Maximum step time is reduced to 2 and the Step End control is "Temperature in Spec" rather than by time. In alternate embodiments, this step 5 is interchangeable with step 4, since the only condition being checked in step 5 is whether the temperature is within a specified range.

In Step 6, now that the reactant flow is stabilized, the deposition begins. The step end control is raised by an order of magnitude, generally between 50 and 100, more preferably between 81 and 96 and will remain so for the duration of the deposition, which extends all the way to step 9. At this point, the heater spacing may be increased to about 325 mils, compared with the typical maximum of 260 mils. Rapid deposition is precipitated by cutting off the flow of oxygen and replacing oxygen with the flow of ozone. The flow of TEOS is increased by about a factor of three. For the 7,000-angstrom film example of FIGS. 5a through 5c, this means increasing the TEOS rate from about 600 sccm to a rate generally within the range of from about 1,000 to about 3,000 sccm, preferably from about 1,550 to about 2,050 sccm, or about 1,800 sccm. The TEB rate may also be adjusted upward or downward as desired, generally from about 195 sccm to 365 sccm.

The steps 6 through 9 are defined for deposition in each of four chambers: A, B, C and D; since this is a four-chamber system where the film can be deposited simultaneously in four different chambers. Thus, the remainder of the recipe is identical for the other chambers, and duplicative explanation is omitted. The deposition is terminated in step 10, "TERM", wherein the step end control, TEOS and TEB flow rates are brought back down to typical levels.

In steps 11 through 13, labeled "P1" through "P3", respectively, the throttle valve setting is gradually adjusted to ensure a smooth transition in pressure. As in typical processes, oxygen is again introduced into the reaction chamber, and the inert gas flow is reduced. In step "P3", the flow of all gasses is halted and the procedure is completed.

Thus, typical BSG deposition rates of around 4,100 angstroms per minute can be boosted to about 5,000 angstroms per minute using the process of the present disclosure. This is achieved by exemplary embodiment processes that conduct the reaction at pressures of about 240 Torr or above, preferably 250 Torr or above, more preferably at least 260 Torr, and still more preferably at 280 Torr or above. The elevated pressure enables boosting the reaction rate to about 4,600 angstroms per minute and increases boron concentration in the BSG film. The reaction rate is increased further and the boron concentration decreased to a predetermined target level by increasing the rate at which TEOS is introduced into the reaction chamber from typical rates, where the typical rate for TEOS flow was 1440±150 milligram per minute, to a rate effective in lowering the boron concentration in the BSG film to about 2.2 to 4% B, preferably from about 2.8 to about 3.4% B, which is achievable at reaction pressures of about 260 Torr by feeding TEOS at rates of about 1800±250 mg/min. The TEB flow rate is 280±85 mg/min compared with typical flow rates of 360±65 mg/min, thus conserving TEB as well in preferred embodiments.

It is to be understood that all physical quantities disclosed herein, unless explicitly indicated otherwise, are not to be construed as exactly equal to the quantity disclosed, but rather as about equal to the quantity disclosed. In addition, the mere absence of a qualifier such as "about", or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the present disclosure. Accordingly, it is to be understood that the present disclosure has been described by way of illustration only, and such illustrations and embodiments as have been disclosed herein are not to be construed as limiting to the claims.

These and other features and advantages of the present disclosure may be readily ascertained by one of ordinary skill in the pertinent art based on the teachings herein. It is to be understood that the teachings of the present disclosure may be implemented in various forms of hardware, software, firmware, special purpose processors, or combinations thereof.

The teachings of the present disclosure are preferably implemented as a combination of hardware and software. Moreover, the software is preferably implemented as an application program tangibly embodied on a program storage unit. The application program may be uploaded to, and executed by, a machine comprising any suitable architecture. Preferably, the machine is implemented on a computer platform having hardware such as one or more Central Processing Units ("CPUs"), a Random Access Memory ("RAM"), and Input/Output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit and an output unit.

It is to be further understood that, because some of the constituent system components and steps depicted in the accompanying drawings may be implemented in software, the actual connections between the system components or the process function blocks may differ depending upon the manner in which the present disclosure is programmed. Given the teachings herein, one of ordinary skill in the pertinent art will be able to contemplate these and similar implementations or configurations of the present disclosure.

Although illustrative embodiments have been described herein with reference to the accompanying drawings, it is to be understood that the present disclosure is not limited to those precise embodiments, and that various changes and modifications may be effected therein by one of ordinary skill in the pertinent art without departing from the scope or spirit of the present disclosure. All such changes and modifications are intended to be included within the scope of the present disclosure as set forth in the appended claims.

What is claimed is:

1. A method for rapidly depositing a borosilicate glass film on a semiconductor wafer within a chemical vapor deposition ("CVD") reaction chamber, the method comprising:
   controlling the pressure within the chamber;
   introducing oxygen into the chamber;
   introducing a carrier gas into the chamber;
   injecting triethyl borate ("TEB") and tetraethyl orthosilicate (TEOS) into the chamber;
   stabilizing the injection of TEB and TEOS, comprising the stabilization of the TEB flow through the chamber;
   adjustably spacing a heater relative to the chamber;
   introducing ozone gas into the chamber; and
   depositing borosilicate glass film at a rate of at least 4,500 angstroms per minute.

2. A method as defined in claim 1 wherein the pressure is controlled above 180 Torr.

3. A method as defined in claim 1 wherein the pressure is controlled between about 240 Torr and 280 Torr.

4. A method as defined in claim 1 wherein the pressure is controlled at 260 Torr.

5. A method as defined in claim 1 wherein the oxygen gas is introduced at a rate of 6000 sccm.

6. A method as defined in claim 1 wherein the carrier gas is a substantially inert gas.

7. A method as defined in claim 1 wherein the carrier gas is introduced at a rate of 8000 sccm.

8. A method as defined in claim 1 wherein the carrier gas comprises helium.

9. A method as defined in claim 1 wherein the injection of TEB is stabilized at a rate between about 205 mgm and 355 mgm.

10. A method as defined in claim 1 wherein the injection of TEB is stabilized at a rate of 300 mgm.

11. A method as defined in claim 1 wherein the injection of TEOS is stabilized at a rate of 600 mgm.

12. A method as defined in claim 1 wherein stabilizing the injection of TEB and TEOS is followed by a step end control responsive to flows within specifications.

13. A method as defined in claim 1 wherein the injection of TEOS is stabilized at a rate between about 1550 mgm and 2050 mgm.

14. A method as defined in claim 1 wherein the depositing occurs while the pressure is controlled at 260 Torr.

15. A method as defined in claim 1 wherein the depositing occurs during a period between about 81 and 96 seconds.

16. A method as defined in claim 1 wherein the borosilicate glass film is deposited at a rate between about 4,500 angstroms per minute and 5,000 angstroms per minute.

17. A method as defined in claim 1 wherein spacing the heater relative to the chamber comprises spacing the heater at from about 180 mils to 325 mils relative to a showerhead.

18. A method as defined in claim 1 wherein spacing the heater relative to the chamber comprises spacing the heater relative to at least one of a showerhead and a chamber lid.

19. A method as defined in claim 1 wherein spacing the heater relative to the chamber comprises spacing the heater at from about 260 mils to 325 mils relative to a showerhead.

20. A method as defined in claim 1 wherein the borosilicate glass film is deposited at a rate of 5,000 angstroms per minute.

21. A method as defined in claim 1 wherein stabilizing takes place within a period of about 5 seconds to 9 seconds.

22. A method as defined in claim 1 wherein stabilizing takes place within a period of 6 seconds.

23. A method as defined in claim 1 wherein stabilizing commences after verification that the temperature of the heater is within a user specified range.

24. A method as defined in claim 1 wherein stabilizing commences after verification that the temperature of the heater is within 10 degrees centigrade of a user specified value.

25. A method as defined in claim 1 wherein depositing is followed by introduction of the carrier gas at a rate of 2000 sccm.

26. A method as defined in claim 1 wherein depositing is followed by pumping out the carrier gas line.

27. A method as defined in claim 1 wherein controlling the pressure within the chamber comprises proportional-integral-derivative ("PID") control.

28. A program storage device readable by machine, tangibly embodying a program of instructions executable by the machine to perform method steps for rapidly depositing a borosilicate glass film on a wafer, the method steps comprising:

controlling the pressure within the chamber;

introducing oxygen into the chamber;

introducing a carrier gas into the chamber;

injecting triethyl borate ("TEB") and tetraethyl orthosilicate (TEOS) into the chamber;

stabilizing the injection of TEB and TEOS, comprising the stabilization of the TEB flow through the chamber;

adjustably spacing a heater relative to the chamber;

introducing ozone gas into the chamber; and depositing borosilicate glass film at a rate of at least 4,500 angstroms per minute.

\* \* \* \* \*